United States Patent [19]

Koshizuka

[11] Patent Number: 4,876,467
[45] Date of Patent: Oct. 24, 1989

[54] TRANSFER CIRCUIT FOR SIGNAL LINES
[75] Inventor: Atuo Koshizuka, Kamifukuoka, Japan
[73] Assignee: Fujitsu Limited, Kawasaki, Japan
[21] Appl. No.: 291,031
[22] Filed: Dec. 28, 1988
[30] Foreign Application Priority Data Jan. 11, 1988 [JP] Japan .................................. 63-2531

[51] Int. Cl.[4] ..................... H03K 17/60; H03K 17/687
[52] U.S. Cl. ..................................... 307/570; 307/446; 307/449; 307/530
[58] Field of Search ............... 307/570, 446, 571, 451, 307/495, 496, 449, 463, 469, 530

[56] References Cited
U.S. PATENT DOCUMENTS 4,300,213 11/1981 Tanimura et al. .................. 307/449
4,783,604 11/1988 Ueno .................................. 307/446
4,798,977  1/1989 Sakui et al. ........................ 307/446

Primary Examiner—Stanley D. Miller
Assistant Examiner—Nancy Thai
Attorney, Agent, or Firm—Armstrong, Nikaido, Marmelstein, Kubovcik & Murray

[57] ABSTRACT

A transfer circuit for signal lines comprises a bipolar transistor and two MIS transistors. A base of the bipolar transistor is connected to a first line of the signal lines, a collector of the bipolar transistor is connected to a power source, the two MIS transistors are connected in series, the connected point is connected to an emitter of the bipolar transistor, and one end of the series-connected MIS transistors is connected to the first line and the other end is connected to a second line of the signal lines. When the first line is transferred to the second line, the MIS transistor connected between the base and emitter of the bipolar transistor is made non-conductive and the other MIS transistor connected to the second line is made conductive. The transfer circuit constituted as above can carry out the transfer of the signal lines at a high speed by rapidly charging the second line.

9 Claims, 5 Drawing Sheets

TRANSFER CIRCUIT FOR SIGNAL LINES

BACKGROUND OF THE INVENTION

1. Field of the Invention

The present invention relates to a transfer circuit for signal lines and utilized, for example, for selectively transferring one of a plurality of local data buses to a common data bus.

2. Description of the Related Art

In a static random access memory (SRAM), a memory cell array is divided into a plurality of blocks, to obtain a low power consumption or a high speed processing. In this case, one of a plurality of local buses connected to the memory cell array block must be selected and the data thereon transferred to a common data bus. This selection and transfer are carried out by a transfer gate circuit.

In a transfer circuit for signal lines using a transfer gate, since all of the transistors are MIS (metal insulator semiconductor) transistors, the resistance in a conductive state is relatively high, the overdrive voltage is low, and the local data bus has a large electrostatic capacity due to the connection of many memory cells. Therefore, a time constant for a charge in the bus is long, and a problem arises in that it takes a long time to transfer data from the local data bus to the common data bus.

The present invention is intended to provide a high speed transfer circuit for signal lines by using a bipolar transistor and MIS transistors.

SUMMARY OF THE INVENTION

An object of the present invention is to provide a high speed operating transfer circuit for signal lines.

According to the present invention, there is provided a transfer circuit for controlling a signal transfer between a first signal line and a second signal line in response to a control signal comprising a first MIS transistor including a first electrode connected to the first signal line, a second electrode, and a gate electrode; a second MIS transistor including a first electrode connected to the second electrode of the first MIS transistor, a second electrode connected to the second signal line, and a gate electrode; and a bipolar transistor including a base electrode connected to the first signal line, a first electrode connected to a power supply line, and a second electrode connected to the first electrode of the second MIS transistor; the gate electrodes of the first MIS transistor and the second MIS transistor being controlled in response to the control signal such that the first MIS transistor and the second MIS transistor operate in a complementary manner.

Other features and advantages of the invention will be apparent from the following description given with reference to the accompanying drawings.

DESCRIPTION OF THE PREFERRED EMBODIMENTS

Prior to an explanation of embodiments of the present invention, a static random access memory (SRAM) wherein transfer circuits for signal lines are applied is explained with reference to FIG. 1.

Figure 1:
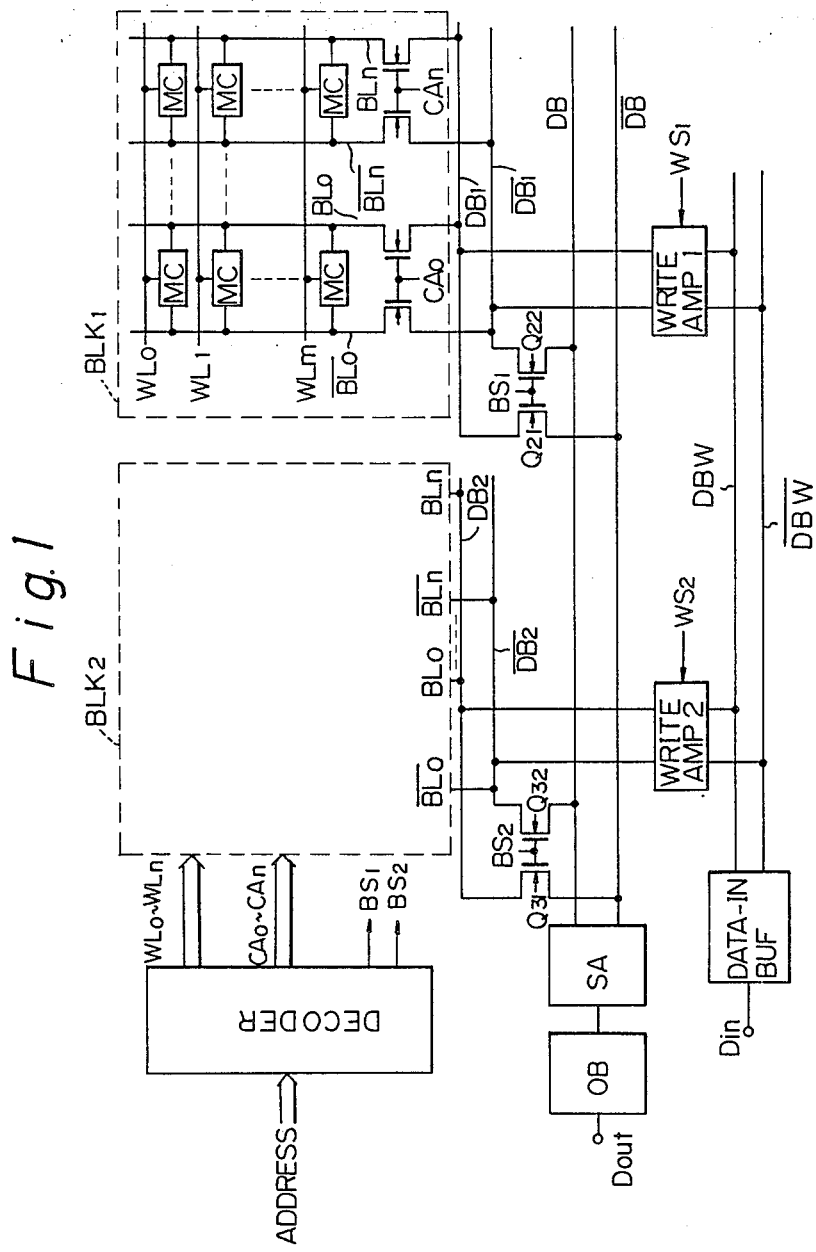
FIG. 1 is a partial circuit diagram of a static random access memory, explaining an application example of a transfer circuit for signal lines.

In FIG. 1, blocks $BLK_1$ and $BLK_2$ enclosed by broken lines are divided into memory cell array blocks (shown as a partially abbreviated diagram). Each block comprises memory cells (MC's) as memory elements, and in each block, one column is selected by column selection circuits controlled by signals $CA_0$ to $CA_n$ from a decoder, and one word line ($WL_0$ to $WL_m$) is selected by the decoder. Then, data is read from an MC arranged at a cross point of the word line and a pair of bit lines (e.g. one pair of $BL_0$, to $\overline{BL_0}$; to $BL_n$, $\overline{BL_n}$) selected by the column selection circuit, and the data is supplied to a common data bus (DB, $\overline{DB}$) through a local data bus (e.g. one pair of $DB_1$, $\overline{DB_1}$; $DB_2$, $\overline{DB_2}$; etc.). The common data bus is connected to a sense amplifier SA and the data is output as $D_{out}$ through an data output buffer OB. Here, a transfer circuit for signal lines must be provided to selectively connect the plurality of local data buses and the common data bus. In FIG. 1, the transfer circuit for signal lines comprises transistors $Q_{21}$, $Q_{22}$, $Q_{31}$, and $Q_{32}$, which are controlled by a signal $BS_1$ or $BS_2$.

Write data ($D_{in}$) for this SRAM is supplied to write amplifiers (WRITE AMP 1 and 2) through a data-in buffer (DATA-IN BUF) and data bus (DBW, $\overline{DBW}$). One memory cell array block is selected by the selection of a write amplifier controlled by a control signal ($WS_1$ or $WS_2$) and the data is supplied to the selected MC through the local data bus.

Figure 2:
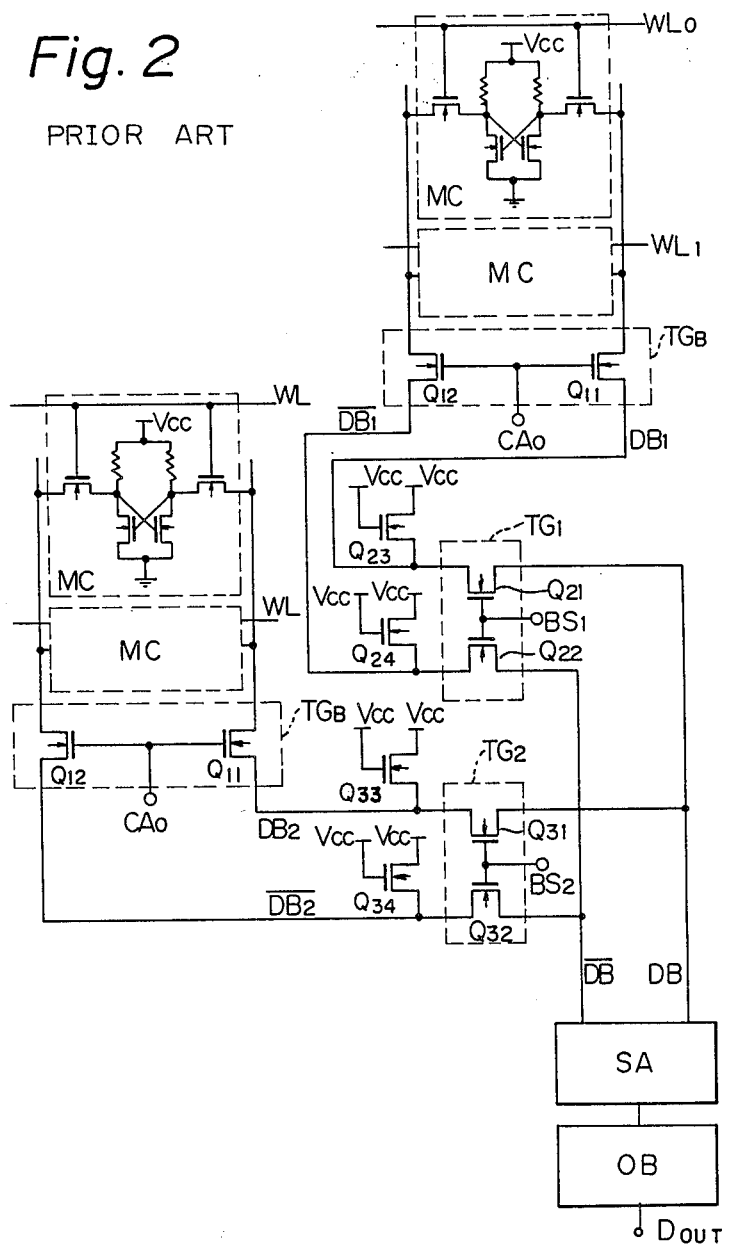
FIG. 2 is a partial circuit diagram of a static random access memory, explaining a conventional transfer circuit for signal lines.

The conventional transfer circuit for signal lines is explained with reference to FIG. 2. FIG. 2 shows a portion of the SRAM in FIG. 1 in detail. In FIG. 2, the same elements as in FIG. 1 are denoted by the same reference characters. Data from each MC is supplied to local data buses ($DB_1$, $\overline{DB_1}$; $DB_2$, $\overline{DB_2}$) through a transfer gate circuit $TG_B$, which comprises transistors $Q_{11}$ and $Q_{12}$, and one of the transfer gate circuits ($TG_1$, $TG_2$) is selected by a block selection control signal ($BS_1$ or $BS_2$) and is made conductive to the common data bus as a transfer circuit for signal line. The $TG_1$ comprises MIS transistors $Q_{21}$ and $Q_{22}$, and each transistor is made conductive by the block selection control signal $BS_1$. MIS transistors $Q_{23}$ and $Q_{24}$ are used to apply a voltage, e.g., Vcc (5 volts), through an effective resistance, so that a floating state thereof does not exist when the local bus is at the nonselection state. The transfer gate $TG_2$ comprises MIS transistors $Q_{31}$ and $Q_{32}$, the power source voltage Vcc is connected to the local data bus ($DB_2$, $\overline{DB_2}$) through MIS transistors $Q_{33}$ and $Q_{34}$, and the operation thereof is the same as that of the $TG_1$. In the conventional transfer circuit for signal lines, since the resistance of the MIS transistors $Q_{21}$, $Q_{22}$, $Q_{31}$, and $Q_{32}$ does not become completely zero in the conductive state thereof, the memory cell having a small power supply capacity cannot charge the common data bus with a large amount of electric current in a short time, and thus the bus transfer time cannot be shortened.

A transfer circuit for signal lines according to a first embodiment of the invention is explained with reference to FIG. 3. Note, in FIG. 3, a portion of the SRAM is abbreviated as in FIG. 2.

Figure 3:
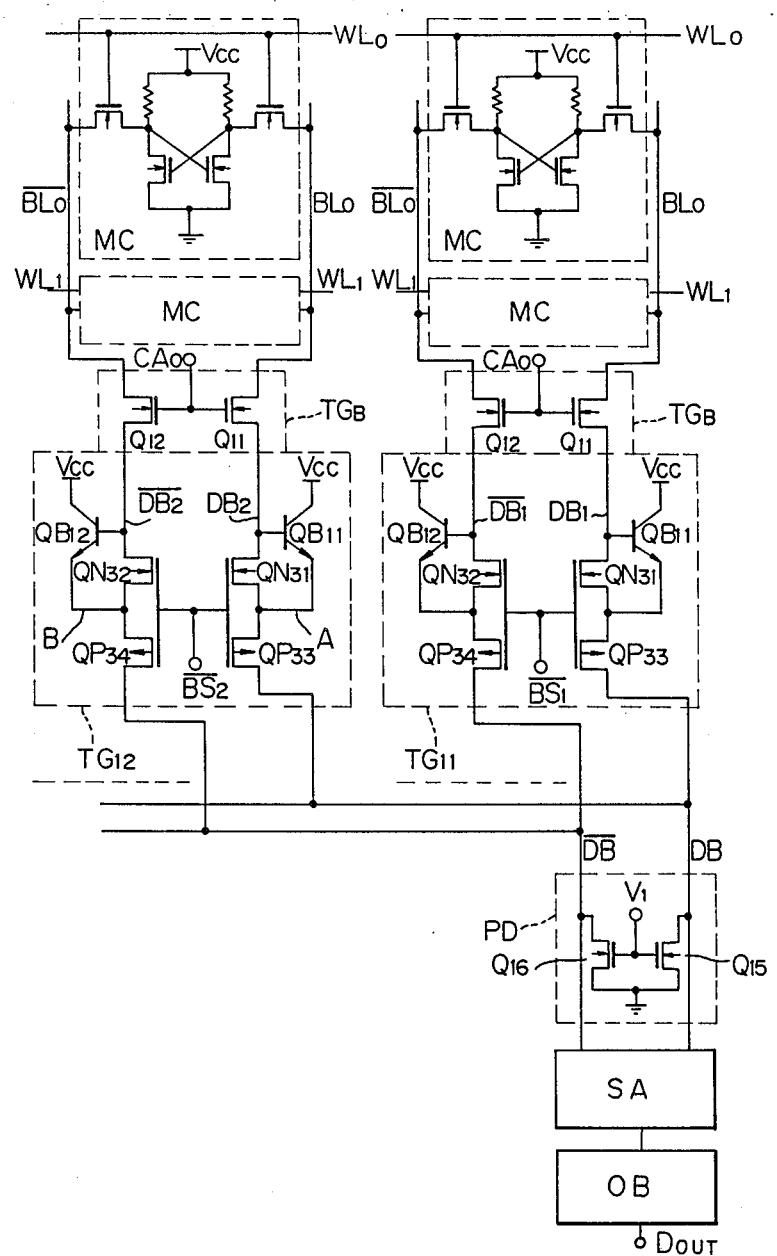
FIG. 3 is a partial circuit diagram of a static random access memory, explaining a transfer circuit for signal lines according to a first embodiment of the invention.

A memory cell is a memory element in the SRAM as shown in FIGS. 1 and 2 and is a flip-flop circuit shown at the top of FIG. 3. The memory cell, for example, comprises four MIS transistors and two resistors, and two series-connected resistors and transistors are arranged in parallel between the power source and ground. A drain of one of the transistors is cross-connected to a gate of another transistor, and vice versa. The gate of each transistor is connected to a MIS transistor to be selected by a word line (WL) and to be connected to a respective bit line. A pair of bit lines ($BL_0$, $\overline{BL_0}$) is connected to a local data bus ($DB_1$, $\overline{DB_1}$) through a transfer gate circuit $TG_B$, which comprises transistors $Q_{11}$ and $Q_{12}$ as a column selection circuit. Another pair of bit lines from another memory cell array block is connected to a local data bus (e.g. $DB_2$, $\overline{DB_2}$) in the same way. The local data bus ($DB_1$, $\overline{DB_1}$) is connected to the common data bus through a transfer gate circuit $TG_{11}$, according to the first embodiment of the invention, and a selection signal $\overline{BS_1}$ makes the transfer gate circuit conductive or disconnects same. The local data bus ($DB_2$, $\overline{DB_2}$) and the local data bus belonging to other blocks are connected and controlled in the same way.

In the following description, the transfer gate circuit $TG_{11}$ (transfer circuit assembly) is explained. The $TG_{11}$ comprises a symmetrical circuit for transmitting a complementary pair of signals. Here, only a half of the symmetrical circuit is explained, but the other half thereof is exactly the same.

The half circuit comprises a bipolar transistor ($QB_{11}$ or $QB_{12}$), an n channel MIS transistor ($QN_{31}$ or $QN_{32}$), and a p channel MIS transistor ($QP_{33}$ or $QP_{34}$). one of the local data bus signal lines $DB_1$ is connected to a base of the NPN type bipolar transistor $QB_{11}$; a collector of the transistor $QB_{11}$ is connected to the power source Vcc; a source of the transistor $QN_{31}$ is connected to a source of the transistor $QP_{33}$; a gate of the transistor $QN_{31}$ is connected to a gate of the transistor $QP_{33}$; a drain of the transistor $QN_{31}$ is connected to the base of the transistor $QN_{11}$; and, a drain of the transistor $QP_{33}$ is connected to the common data bus DB. For another signal line $\overline{DB_1}$ of the local data bus, the transistor $QB_{11}$ is replaced by the transistor $QB_{12}$, the transistor $QN_{31}$ is replaced by the transistor $QN_{32}$, the transistor $QP_{33}$ is replaced by the transistor $QP_{34}$, and the drain of the transistor $QP_{34}$ is connected to the common data bus $\overline{DB}$. The remaining circuit constitution of the another signal line of the local data bus is the same as that of one of the local data bus signal lines. Note, the interconnected MIS transistor gates are supplied with the selection signal $\overline{BS_1}$.

Also, the above-mentioned circuit constitution is applied to the transfer gate circuit $TG_{12}$ to which the local data bus ($DB_2$, $\overline{DB_2}$) is connected, as for $TG_{11}$.

If the line to be transferred is not complementary to a bus line but is an individual line, a half circuit application in the symmetrical circuit is sufficient.

An operation of this circuit of the first embodiment is now explained. When data is transferred from the local data bus to the common data bus, the selection signal $\overline{BS_1}$ is at a "low" level, the n channel MIS transistors $QN_{31}$ and $QN_{32}$ are OFF, and the p channel MIS transistors $QP_{33}$ and $QP_{34}$ are ON (conductive). The data signal on the local data bus $DB_1$ is applied to the base of the transistor $QB_{11}$, the current is amplified, and the data is transferred to the common data bus DB instantly through the emitter of the transistor $QB_{11}$ and the transistor $QP_{33}$. Similarly, a data signal on the local data bus $\overline{DB_1}$ is applied to the base of the transistor $QB_{12}$, the current is amplified, and the data is transferred to the common data bus $\overline{DB}$ instantly through the emitter of the transistor $QB_{12}$ and the transistor $QP_{34}$.

When the data transfer is inhibited, the selection signal $\overline{BS_1}$ is at a high level, the n channel transistors $QN_{31}$ and $QN_{32}$ are ON, and the p channel transistors $QP_{33}$ and $QP_{34}$ are OFF. Accordingly, the transistor $QB_{11}$ and $QB_{12}$ are made OFF by a short circuit between the base and emitter thereof, and thus the data signals from the local data bus ($DB_1$, $\overline{DB_1}$) are completely disconnected.

In the above operation, since the transistor $QN_{31}$ is short circuited during the non-selection time, delay of the conductive operation at the next step is prevented due to the absence of an emitter voltage higher than the base voltage in the transistor $QB_{11}$. The bipolar transistor $QB_{11}$ amplifies the signal current from the MC by using an emitter follower, the transistor $QP_{33}$ supplies the electric current from the transistor $QB_{11}$ to the common data bus DB when the transfer circuit for signal lines is in a selection state, and the transistor $QP_{33}$ disconnects the signal from the MC so that the signal from the bus $DB_1$ does not reach the bus DB when the transfer circuit is in a non-selection state.

The common data bus is connected to a sense amplifier SA, and the data is output through an output buffer circuit. A pull-down circuit PD is connected to the common data bus. This circuit PD comprises two MIS transistors $Q_{15}$ and $Q_{16}$, and a drain of the transistor $Q_{15}$ is connected to the common data bus DB and a drain of the transistor $Q_{16}$ is connected to the common data bus $\overline{DB}$. Sources of the transistors $Q_{15}$ and $Q_{16}$ are grounded and bases of the transistors $Q_{15}$ and $Q_{16}$ are connected to the power source $V_1$ or Vcc. The circuit PD, lowers the bus voltage when the voltage of the common data bus is changed from high to low. The channel widths of the transistors $Q_{15}$ and $Q_{16}$ are made narrower than that of the MIS transistor $QP_{33}$ or the like.

Figure 7:
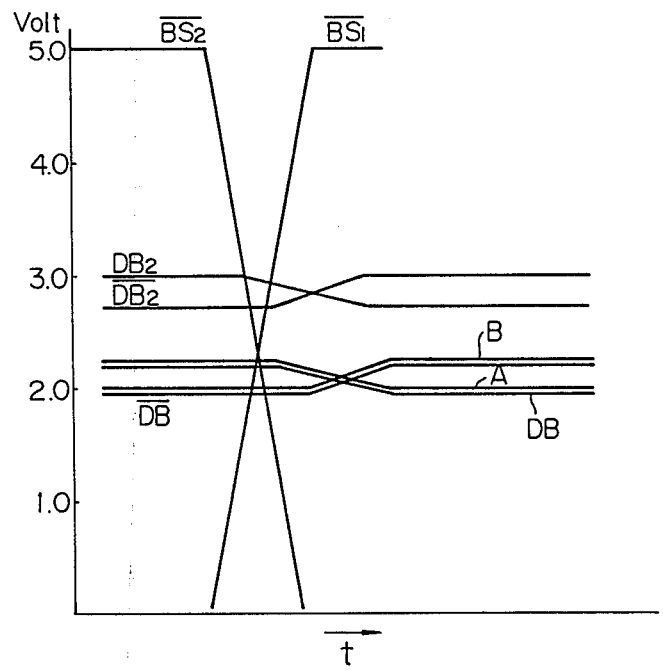
FIG. 7 is a waveform diagram in the transfer circuit for the signal lines shown in FIG. 3.

Assuming that the voltage levels of connecting points between the sources of the transistors $QN_{31}$ and $QP_{33}$ and between the sources of the transistors $Q_{32}$ and $QP_{34}$ are A and B, respectively, as shown in FIG. 3, the voltage levels of the connecting points, of the local data bus ($DB_2$, $\overline{DB_2}$) and of the common data bus (DB, $\overline{DB}$) are as shown in FIG. 7. The waveforms in FIG. 7 are generated when a high level of the selection signal is transferred from $\overline{BS_2}$ to $\overline{BS_1}$. In FIG. 7, the axis of the ordinates shows a voltage (volt) and the quadrature axis shows the time (t).

When using the above-mentioned circuit, since the current of the data signal through the local data bus is amplified, the common data bus is charged by a large amount of electric current, and thus the transfer time for the data becomes very short and a high speed transfer is possible.

Figure 4:
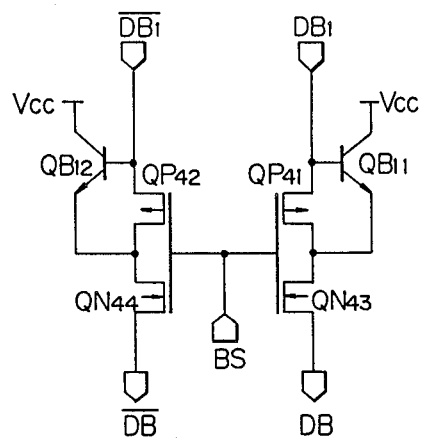
FIG. 4 is a circuit diagram of a transfer circuit for signal lines according to a second embodiment of the present invention.

A circuit diagram of a transfer circuit for signal lines according to a second embodiment of the invention is shown in FIG. 4. This circuit comprises two NPN type bipolar transistors $QB_{11}$ and $QBV_{12}$, two p channel MIS transistors $QP_{41}$ and $QP_{42}$, and two n channel MIS transistor and $QN_{43}$ and $QN_{44}$.

The local data bus $DB_1$ is connected to the base of the transistor $QB_{11}$ and a drain of the transistor $QP_{41}$, and the collector of the transistor $QB_{11}$ is connected to the power source Vcc. Sources of the transistors $QP_{41}$ and $QN_{43}$ are interconnected and the connecting point is connected to the emitter of the transistor $QB_{11}$, and a drain of transistor $QN_{43}$ is connected to the common data bus DB. Gates of the transistors $QP_{41}$ and $QN_{43}$ are interconnected and are applied with a selection signal BS.

The local data bus $\overline{DB_1}$ is connected to the base of the transistor $QB_{12}$ and a drain of the transistor $QPO_{42}$, the collector of the transistor $QB_{12}$ is connected to the power source Vcc, sources of the transistors $QP_{42}$ and $Qn_{44}$ are interconnected and the connecting point is connected to the emitter of the transistor $QB_{12}$, and a drain of the transistor $QN_{44}$ is connected to the common data bus $\overline{DB}$. Gates of the transistors $QP_{42}$ and $QN_{44}$ are interconnected and are applied with a selection signal BS. In this circuit, during the selection (i.e. the signal BS is high level), the transistors $QP_{41}$ and $QP_{42}$ are OFF and the transistors $QN_{43}$ and $QN_{44}$ are ON. The operation of this circuit is the same as that of the first embodiment.

Figure 5:
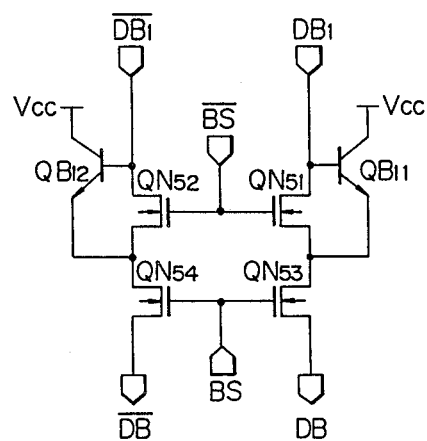
FIG. 5 is a circuit diagram of a transfer circuit for signal lines according to a third embodiment of the present invention.

A circuit diagram of a transfer circuit for signal lines according to a third embodiment of the invention is shown in FIG. 5. This circuit comprises two NPN type bipolar transistors $QB_{11}$ and $QB_{12}$ and four n channel MIS transistors $QN_{51}$, $QN_{52}$, $QN_{53}$, and $QN_{54}$.

The local data bus $DB_1$ is connected to the base of the transistor $QB_{11}$ and a drain of the transistor $QN_{51}$, the collector of the transistor $QB_{11}$ is connected to the power source Vcc, sources of the transistors $QN_{51}$ and $QN_{53}$ are interconnected and the connecting point is connected to the emitter of the transistor $QB_{11}$, and a drain of the transistor $QN_{53}$ is connected to the common data bus DB. A gate of the transistors $QN_{51}$ is supplied with the signal $\overline{BS}$, and a gate of the transistor $QN_{53}$ is supplied with the signal BS (inverted $\overline{BS}$ signal).

The local data bus $\overline{DB_1}$ is connected to the base of the transistor $QB_{12}$ and a drain of the transistor $QN_{52}$, the collector of the transistor $QB_{12}$ is connected to the power source Vcc, sources of the transistors $QN_{52}$ and $Qn_{54}$ are interconnected and the connecting point is connected to the emitter of the transistor $QB_{12}$, and a drain of the transistor $QN_{54}$ is connected to the common data bus $\overline{DB}$. A gate of the transistor $QN_{52}$ is supplied with the selection signal $\overline{BS}$ and a gate of the transistor $QN_{54}$ is supplied with the selection signal BS. In this circuit, during the transfer State (i.e. the signal BS is high and the signal $\overline{BS}$ is low level), the transistors $QN_{51}$ and $QN_{52}$ are OFF and the transistors $QN_{53}$ and $QN_{54}$ are ON. The operation of this circuit is the same as that of the first embodiment.

Figure 6:
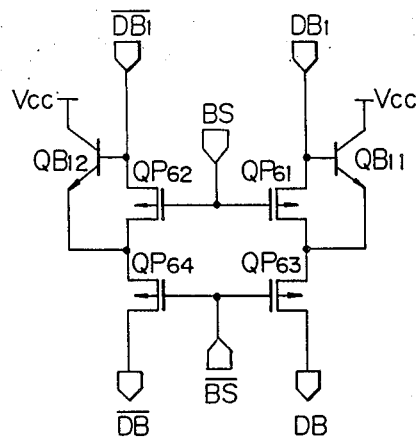
FIG. 6 is a circuit diagram of a transfer circuit for signal lines according to a fourth embodiment of the present invention.

A circuit diagram of a transfer circuit for signal lines according to a fourth embodiment of the invention is shown in FIG. 6. This circuit comprises two NPN type bipolar transistors $QB_{11}$ and $QB_{12}$ and four p channel MIS transistors $QP_{61}$, $QP_{62}$, $QP_{63}$, and $QP_{64}$.

The local data bus $DB_1$ is connected to the base of the transistor $QB_{11}$ and a drain of the transistor $QP_{61}$, the collector of the transistor $QB_{11}$ is connected o the power source Vcc, sources of the transistors $QP_{61}$ and $QP_{63}$ are interconnected and the connecting point is connected to the emitter of the transistor $QB_{11}$, and a drain of the transistor $QP_{63}$ is connected to the common data bus DB. A gate of the transistor $QP_{61}$ is supplied with the selection signal BS, and a gate of the transistor $QP_{63}$ is supplied with the selection signal $\overline{BS}$.

The local data bus $\overline{DB_1}$ is connected to the base of the transistor $QB_{12}$ and a drain of the transistor $QP_{62}$, the collector of the transistor $QB_{12}$ is connected to the power source Vcc, sources of the transistors $QP_{62}$ and $QP_{64}$ are interconnected and the connecting point is connected to the emitter of the transistor $QB_{12}$, and a drain of the transistor $QP_{64}$ is connected to the common data bus $\overline{DB}$. A gate of the transistor $QP_{62}$ is supplied with the selection signal BS and a gate of the transistor $QP_{64}$ is supplied with the selection signal $\overline{BS}$. In this circuit, during the transfer state the transistors $QP_{61}$ and $QP_{62}$ are OFF and the transistors $QP_{63}$ and $QP_{64}$ are ON. The operation of this circuit is the same as that of the first embodiment.

In the above-mentioned description of the embodiments, a pair of transfer circuits is used with transfer buses supplied with a pair of complementary signals, but this transfer circuit for signal lines can function using only one of the pair of circuits, to transfer data from one signal line to another signal line.

I claim:

1. A transfer circuit for controlling a signal transfer between a first signal line and a second signal line in response to a control signal comprising:
    a first MIS transistor including a first electrode connected to the first signal line, a second electrode, and a gate electrode;
    a second MIS transistor including a first electrode connected to the second electrode of the first MIS transistor, a second electrode connected to the second signal line, and a gate electrode; and
    a bipolar transistor including a base electrode connected to the first signal line, a first electrode connected to a power supply line, and a second electrode connected to the first electrode of the second MIS transistor;
    the gate electrodes of the first MIS transistor and the second MIS transistor being controlled in response to the control signal such that the first MIS transistor and the second MIS transistor operate in a complementary manner.

2. A transfer circuit as set forth in claim 1, wherein the bipolar transistor is an NPN type transistor.

3. A transfer circuit as set forth in claim 1, wherein the first MIS transistor is an n channel type transistor and the second MIS transistor is a p channel type transistor.

4. A transfer circuit as set forth in claim 1, wherein the first MIS transistor is a p channel type transistor and the second MIS transistor is an n channel type transistor.

5. A transfer circuit as set forth in claim 1, wherein the first MIS transistor and the second MIS transistor are n channel type transistors.

6. A transfer circuit as set forth in claim 1, wherein the first MIS transistor and the second MIS transistor are p channel type transistors.

7. A transfer circuit as set forth in claim 1, further comprising a pull-down circuit connected to the second signal line.

8. A transfer circuit as set forth in claim 7, wherein the pull-down circuit comprises an MIS transistor having a drain connected to the second line, a source connected to the ground, and a gate to which is supplied a voltage at a level such that the MIS transistor has a higher resistance value than that of the second MIS transistor in the conductive state.

9. A transfer circuit as set forth in claim 1, further comprising:

a third MIS transistor including a first electrode connected to a third signal line, a second electrode, and a gate electrode connected to the gate electrode of the first MIS transistor;

a fourth MIS transistor including a first electrode connected to the second electrode of the third MIS transistor, a second electrode connected to a fourth signal line, and a gate electrode connected to the gate electrode of the second MIS transistor; and another bipolar transistor including a base electrode connected to the third signal line, a first electrode connected to the power supply line, and a second electrode connected to the first electrode of the fourth MIS transistor;

whereby, complementary signals are transferred between the first and third signal lines and the second and fourth signal lines.

* * * * *